United States Patent
Kawashima et al.

(10) Patent No.: US 8,242,025 B2
(45) Date of Patent: Aug. 14, 2012

(54) METHOD FOR PRODUCING SEMICONDUCTOR CHIP, AND FIELD EFFECT TRANSISTOR AND METHOD FOR MANUFACTURING SAME

(75) Inventors: Takahiro Kawashima, Osaka (JP); Tohru Saitoh, Osaka (JP); Tohru Nakagawa, Shiga (JP); Hideo Torii, Osaka (JP)

(73) Assignee: Panasonic Corporation, Osaka (JP)

( * ) Notice: Subject to any disclaimer, the term of this patent is extended or adjusted under 35 U.S.C. 154(b) by 762 days.

(21) Appl. No.: 12/159,352

(22) PCT Filed: Jan. 12, 2007

(86) PCT No.: PCT/JP2007/050282
§ 371 (c)(1),
(2), (4) Date: Jun. 26, 2008

(87) PCT Pub. No.: WO2007/083570
PCT Pub. Date: Jul. 26, 2007

(65) Prior Publication Data
US 2010/0224915 A1    Sep. 9, 2010

(30) Foreign Application Priority Data

Jan. 16, 2006  (JP) .................................. 2006-007064
Feb. 15, 2006  (JP) .................................. 2006-038047

(51) Int. Cl.
*H01L 21/301* (2006.01)

(52) U.S. Cl. ........ 438/738; 438/737; 438/739; 438/745; 257/E21.214; 257/E21.219

(58) Field of Classification Search .......... 438/106–127, 438/455–459, 689–757; 257/E21.214, E21.219
See application file for complete search history.

(56) References Cited

U.S. PATENT DOCUMENTS

| | | | |
|---|---|---|---|
| 5,073,230 A * | 12/1991 | Maracas et al. ............... | 438/458 |
| 6,424,020 B1 * | 7/2002 | Vu et al. ......................... | 257/507 |
| 6,507,989 B1 * | 1/2003 | Bowden et al. .............. | 29/592.1 |
| 6,525,352 B1 * | 2/2003 | Muller et al. .................. | 257/252 |

(Continued)

FOREIGN PATENT DOCUMENTS
JP    2000-040812 A    2/2000
(Continued)

OTHER PUBLICATIONS

Menard, E. et al. "A printable form of silicon for high performance thin film transistors on plastic substrates", Applied Physics Letters, vol. 84, No. 26, Jun. 28, 2004, pp. 5398-5400.

*Primary Examiner* — Kiesha Bryant
*Assistant Examiner* — Eric Ward
(74) *Attorney, Agent, or Firm* — Hamre, Schumann, Mueller & Larson, P.C.

(57) ABSTRACT

According to a method of the present invention for manufacturing a semiconductor piece, at least two semiconductor layers (12) are first formed on a substrate (10) by stacking a sacrificial layer (11) and the semiconductor layer (12) on the substrate (10) in this order and repeating this stacking. Next, the semiconductor layers (12) are divided into pieces by etching part of the sacrificial layers (11) and part of the semiconductor layers (12). Then, the pieces are separated from the substrate by removing the sacrificial layers (11).

12 Claims, 14 Drawing Sheets

U.S. PATENT DOCUMENTS

| | | | |
|---|---|---|---|
| 6,746,890 B2 * | 6/2004 | Gupta et al. | 438/50 |
| 6,858,518 B2 * | 2/2005 | Kondo | 438/458 |
| 7,018,549 B2 * | 3/2006 | Metz et al. | 216/2 |
| 7,074,635 B2 * | 7/2006 | Kim et al. | 438/50 |
| 7,432,523 B2 * | 10/2008 | Ogihara | 257/13 |
| 2003/0157783 A1 * | 8/2003 | Fonash et al. | 438/458 |
| 2005/0191448 A1 | 9/2005 | Suh et al. | |
| 2006/0049487 A1 * | 3/2006 | Sato et al. | 257/620 |
| 2006/0134893 A1 * | 6/2006 | Savage et al. | 438/483 |
| 2006/0138629 A1 * | 6/2006 | Fukazawa | 257/686 |
| 2008/0108171 A1 * | 5/2008 | Rogers et al. | 438/73 |
| 2010/0055620 A1 * | 3/2010 | Kwon | 430/323 |

FOREIGN PATENT DOCUMENTS

| | | |
|---|---|---|
| JP | 2003-324200 A | 11/2003 |
| JP | 2005-260221 A | 9/2005 |
| WO | WO 2004/032193 A2 | 4/2004 |

* cited by examiner

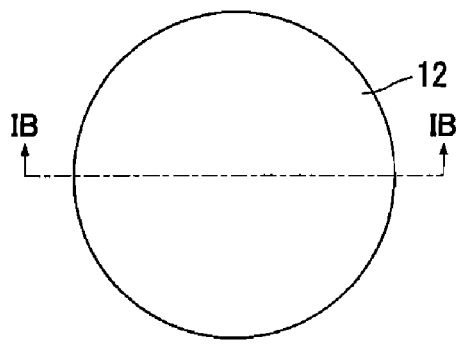
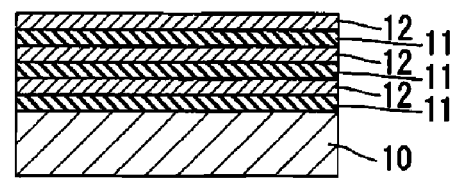
Fig. 1A    Fig. 1B
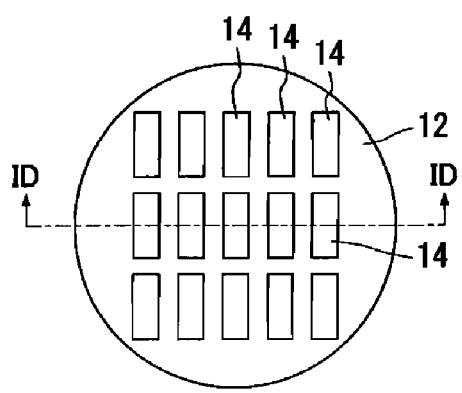
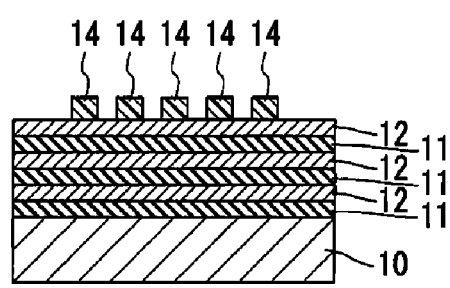
Fig. 1C    Fig. 1D
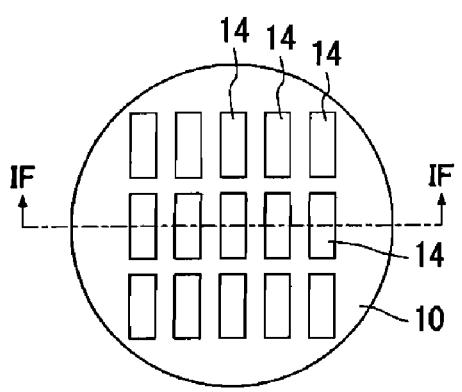
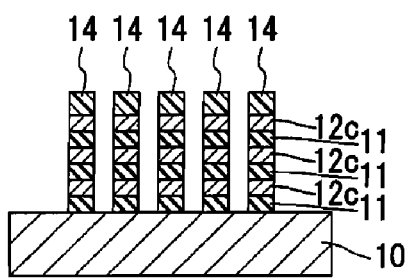
Fig. 1E    Fig. 1F

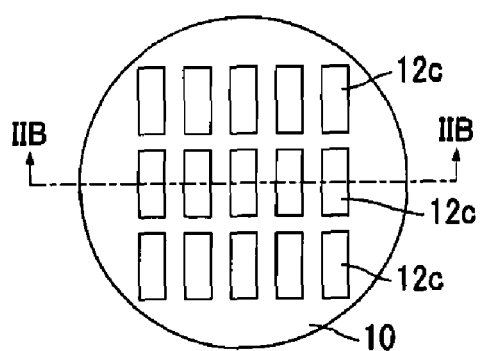 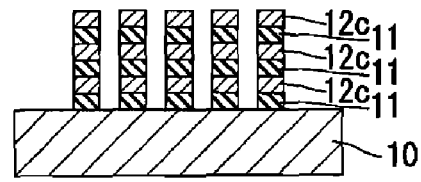
Fig. 2A    Fig. 2B
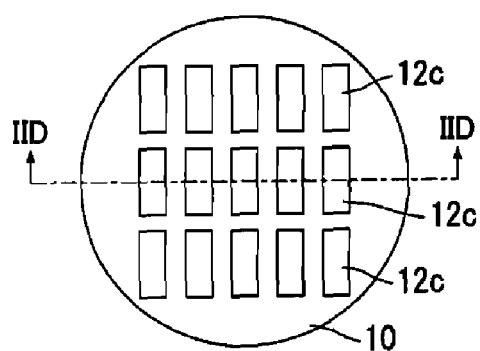 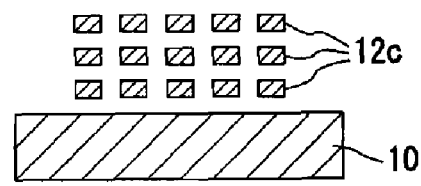
Fig. 2C    Fig. 2D
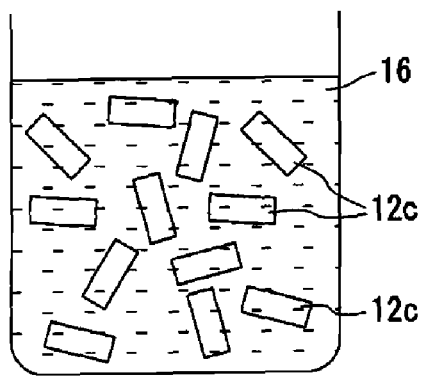
Fig. 2E

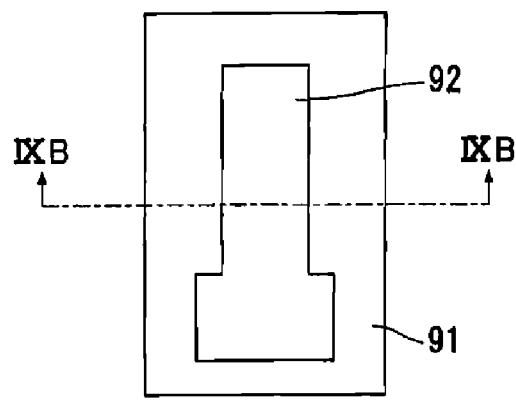
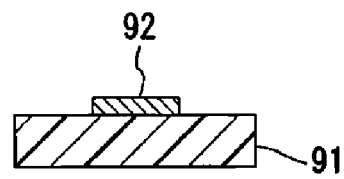
Fig. 9A  Fig. 9B
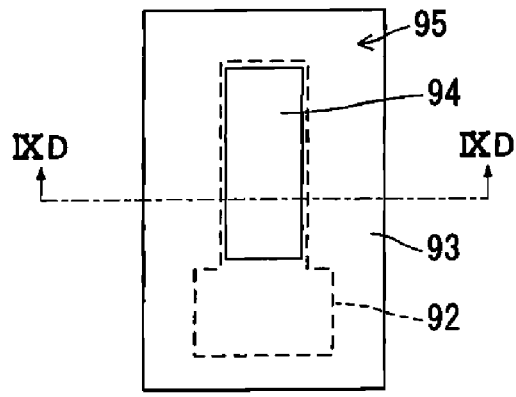
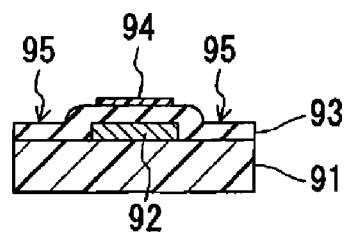
Fig. 9C  Fig. 9D
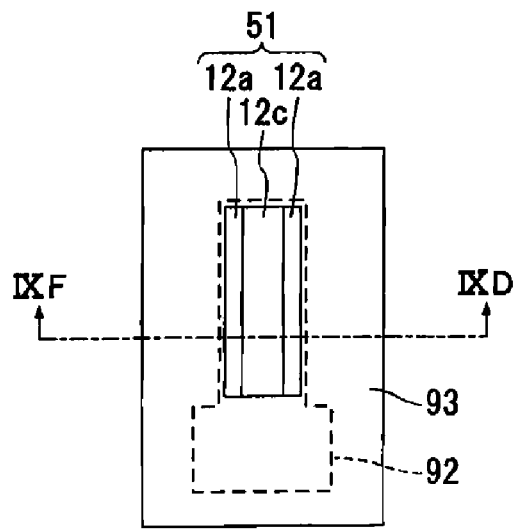
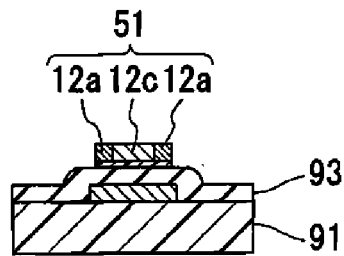
Fig. 9E  Fig. 9F

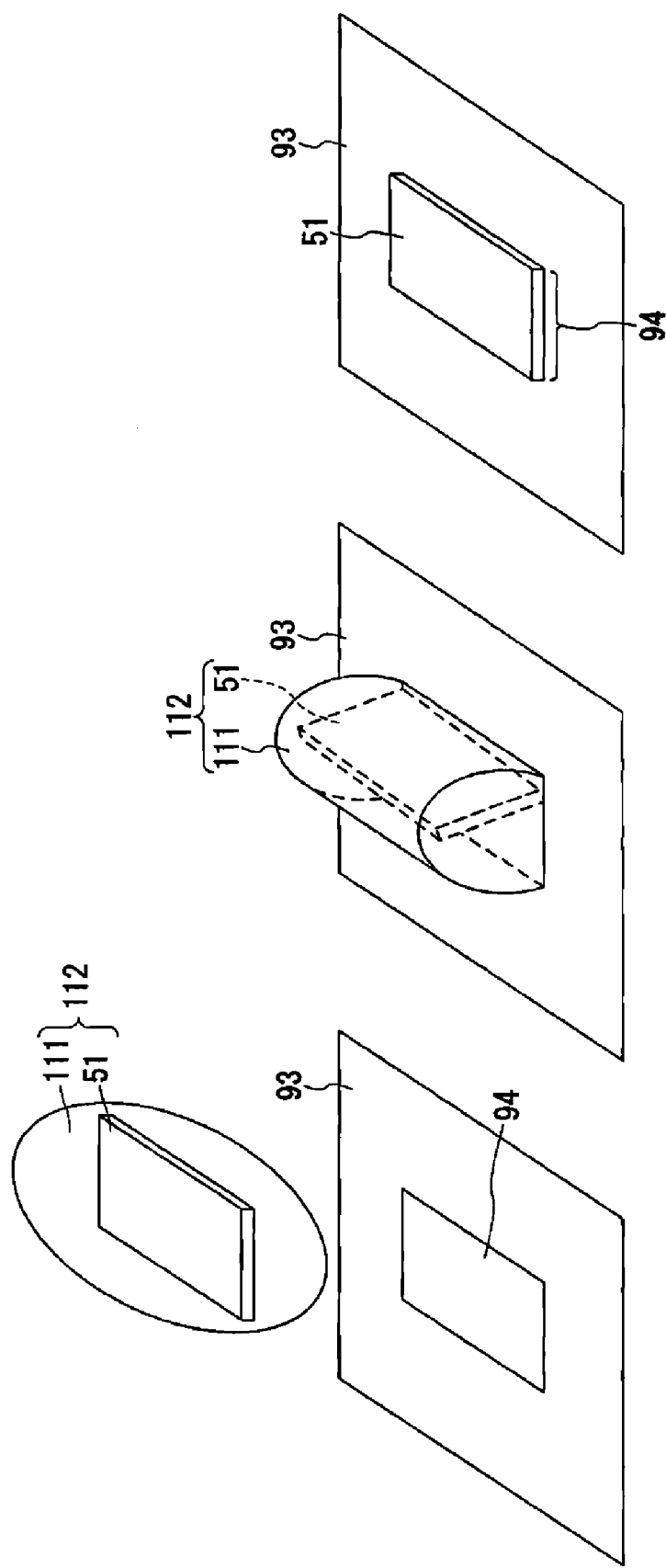

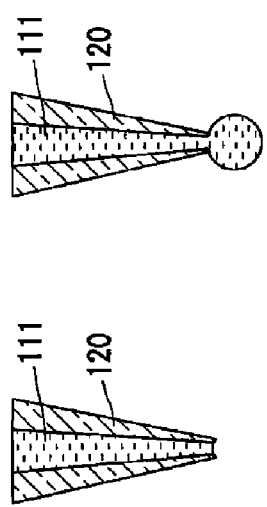
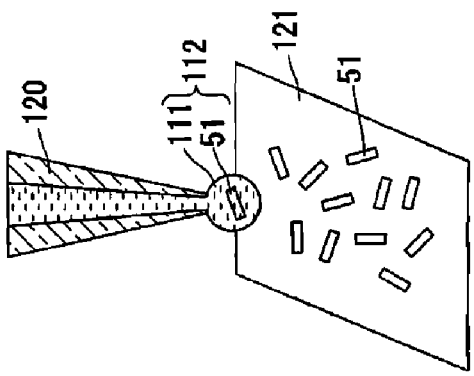
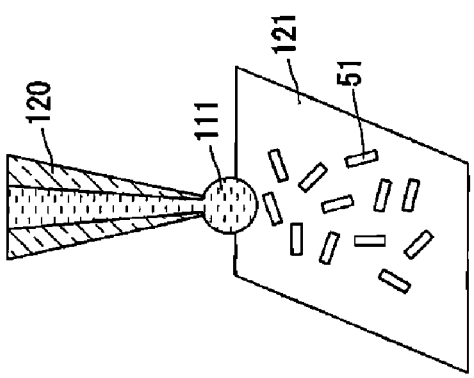
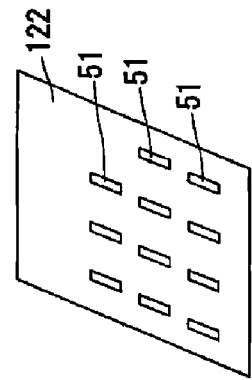
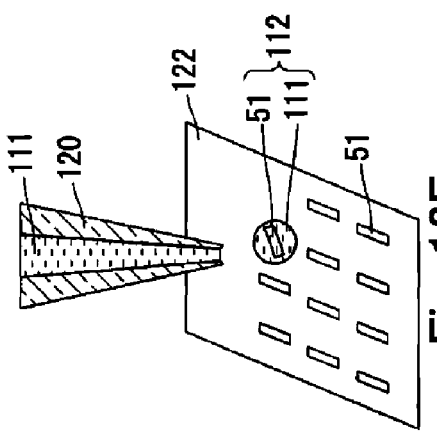
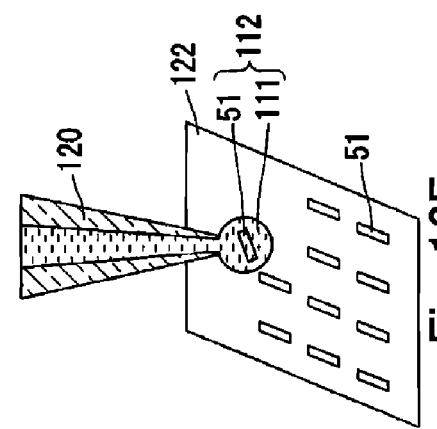

METHOD FOR PRODUCING SEMICONDUCTOR CHIP, AND FIELD EFFECT TRANSISTOR AND METHOD FOR MANUFACTURING SAME

TECHNICAL FIELD

The present invention relates to a method of manufacturing a semiconductor piece, and a field-effect transistor and a method of manufacturing the same.

BACKGROUND ART

Active-type liquid crystal displays and organic electroluminescence displays are formed on glass substrates. Pixels arranged in the form of a matrix on a glass substrate are controlled by transistors disposed in the vicinity of the pixels. Since it is difficult to form a transistor made of a semiconductor single crystal on a glass substrate, a thin-film transistor (TFT) using amorphous silicon or polysilicon is used for controlling the pixels. A TFT has an advantage in that it can be formed on a substrate having a large area at low cost. It has, however, a problem that it cannot operate at high speed due to its low mobility compared with crystalline silicon. A TFT has another problem that materials to be used for a substrate are limited because the substrate has to be kept at high temperature in forming a semiconductor film thereon. In order to solve these problems, a method of using silicon pieces taken out of an SOI substrate as transistor channel regions has been proposed (see "A printable form of silicon for high performance thin film transistors on plastic substrates", Applied Physics Letters, vol. 84, 2004, pp. 5398).

According to this method, the process begins by forming patterns on an SOI layer so that each pattern has a larger area than a channel region. Next, silicon pieces are separated from the substrate by wet etching with hydrofluoric acid. Then, the silicon pieces are collected from the hydrofluoric acid and disposed respectively between source electrodes and drain electrodes. Thus, a thin-film transistor is formed. The channel region of this transistor is formed of single crystal silicon. Therefore, this method makes it possible to form a transistor with a mobility exceeding 100 $cm^2V^{-1}s^{-1}$.

However, according to the above-mentioned conventional method in which silicon pieces are formed from an SOI substrate, it is difficult to freely change the thickness of the silicon pieces. In addition, there is another problem that the cost of the SOI substrate is high. There is still another problem in the conventional manufacturing method that only a limited number of silicon pieces can be produced from a single SOI substrate.

DISCLOSURE OF INVENTION

Under these circumstances, it is one of the objects of the present invention to provide a novel method of manufacturing semiconductor pieces, a novel field-effect transistor, and a novel method of manufacturing the field-effect transistor.

A method of manufacturing a semiconductor piece of the present invention includes the steps of: (i) stacking a sacrificial layer and a semiconductor layer on a substrate in this order, and repeating the stacking so as to form the semiconductor layers on the substrate, the number of the semiconductor layers being at least two; (ii) etching part of the sacrificial layers and part of the semiconductor layers so as to divide the semiconductor layers into pieces; and (iii) removing the sacrificial layers so as to separate the pieces from the substrate.

A field-effect transistor of the present invention includes: a semiconductor piece in which two low-resistance regions are formed and at least a portion of a region sandwiched by the two low-resistance regions serves as a channel region; a source electrode that is connected to one of the low-resistance regions; a drain electrode that is connected to the other low-resistance region; and a gate electrode that is disposed in the vicinity of the semiconductor piece.

A method of manufacturing a field-effect transistor of the present invention includes the steps of: (I) manufacturing a semiconductor piece by the manufacturing method according to claim 1; and (II) connecting a source electrode and a drain electrode to the semiconductor piece.

According to the manufacturing method of the present invention, a large number of semiconductor pieces can be manufactured from a single substrate. Therefore, the manufacturing method of the present invention makes it possible to manufacture semiconductor pieces at a lower cost than the conventional manufacturing method.

The method of the present invention also makes it possible to easily change the thickness of semiconductor pieces, which gives greater flexibility in designing the shape of the semiconductor pieces.

BRIEF DESCRIPTION OF DRAWINGS

FIGS. 1A to 1F are process diagrams showing an example of a method of the present invention for manufacturing semiconductor pieces.

FIGS. 2A to 2E are diagrams showing steps following the steps shown in FIGS. 1A to 1F.

FIGS. 9A to 9F are process diagrams showing an example of the method of the present invention for manufacturing a field-effect transistor.

FIGS. 11A to 11C are diagrams for explaining the steps shown in FIGS. 9E and 9F.

FIGS. 12A to 12G are diagrams for explaining the steps shown in FIGS. 11A to 11C.

BEST MODE FOR CARRYING OUT THE INVENTION

Figure 3A:
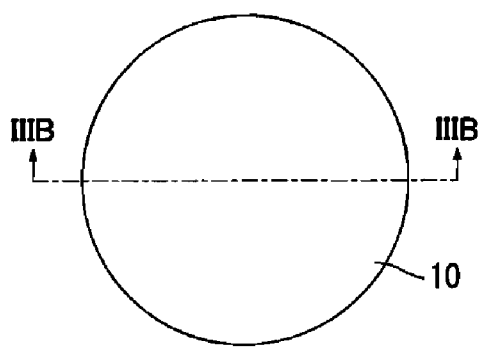
FIGS. 3A to 3D are process diagrams showing another example of the method of the present invention for manufacturing semiconductor pieces.

Embodiments of the present invention will be described below. It should be noted that the present invention is not limited to the following embodiments. In the following description, a specific numerical value or a specific material may be illustrated as an example. However, other numerical values or other materials may be applied as long as the advantageous effects of the present invention can be attained.

[Manufacturing Method of Semiconductor Pieces]

In the manufacturing method of the present invention, the process begins by stacking a sacrificial layer and a semiconductor layer on a substrate in this order, and repeating the stacking so as to form at least two semiconductor layers on the substrate (Step (i)). For example, a sacrificial layer, a semiconductor layer, a sacrificial layer and a semiconductor layer are stacked on a substrate in this order. The number of semiconductor pieces produced from a single substrate increases as the number of stacked semiconductor layers increases. The number of semiconductor layers may be two, three, four or more.

The sacrificial layer is a layer to be etched away selectively in the following step. Therefore, the sacrificial layer is formed of a material having a higher etching rate than the substrate and the semiconductor layer. The etching rate of the sacrificial layer preferably is at least three times higher than that of the semiconductor layer, and more preferably at least ten times higher.

The substrate is selected depending on the materials of the sacrificial layer and the semiconductor layer to be formed thereon. Examples of the materials that may be used for the substrate include single crystal silicon, glass, sapphire, GaAs, and MgO. Other examples of the materials for the substrate include plastic such as polyimide, phenolic resin, and unsaturated polyester resin.

The semiconductor layer is made of a semiconductor. The semiconductor layer is divided into a plurality of semiconductor pieces in the following step. Examples of the materials for the semiconductor layer include Group IV semiconductors such as Si, Ge, SiGe and SiGeC, Group III-V semiconductors such as GaAs, GaP, GaAsP, GaSb, InP, InAs and InAsP, and Group II-VI semiconductors such as ZnS, ZnSe, CdS and CdSe.

The semiconductor layer may be formed by a known method. For example, it may be formed by an epitaxial growth method. For example, a vapor phase deposition method such as a UHV-CVD method, a LP-CVD method, a plasma CVD method, a MOCVD method and a MBE method may be used. A liquid phase growth method such as a sol-gel method and a metalorganic decomposition (MOD) method may also be used. The sacrificial layer also can be formed by the same method as for the semiconductor layer.

Next, part of the sacrificial layers and part of the semiconductor layers are etched so as to divide the semiconductor layers into a plurality of pieces (Step (ii)). Step (ii) can be carried out by a method commonly used in the process of producing semiconductor devices. For example, the semiconductor layers can be divided into pieces by photolithography and etching.

Next, the sacrificial layers are removed so as to separate the semiconductor pieces from the substrate (Step (iii)). Thus, the semiconductor pieces are produced. In Step (iii), the sacrificial layers that have not yet removed in Step (ii) and still remain on the substrate are removed. The sacrificial layers can be removed selectively by using an appropriate etching method.

In the manufacturing method of the present invention, the sacrificial layers may be removed by wet etching in Step (iii).

The manufacturing method of the present invention further may include a step of lowering the resistance of a portion of the semiconductor piece (both ends thereof, for example) before Step (iii). This step may be carried out during Step (i), or after Step (i) but before Step (iii). The resistance of a portion of the semiconductor piece is lowered to form a low-resistance region thereon. The low-resistance region may be formed by doping an impurity with a concentration of at least $1 \times 10^{18}$ atoms/cm$^3$. The low-resistance region also may be formed by alloying a portion of the semiconductor piece.

In the manufacturing method of the present invention, Step (i) may be steps of stacking the sacrificial layer, the semiconductor layer and an insulating layer in this order, and repeating the stacking. Step (ii) may be a step of etching part of the sacrificial layers, part of the semiconductor layers, and part of the insulating layers so as to divide the semiconductor layers and the insulating layers into pieces. This method makes it possible to produce a semiconductor piece having insulating layers stacked on one principal surface thereof. The insulating layer can be used as a gate insulating layer of a field-effect transistor.

In the manufacturing method of the present invention, Step (i) may be steps of stacking the sacrificial layer, the semiconductor layer, the insulating layer, and a conductive layer in this order, and repeating the stacking. Step (ii) may be a step of etching part of the sacrificial layers, part of the semiconductor layers, part of the insulating layers, and part of the conductive layers so as to divide the semiconductor layers, the insulating layers and the conductive layers into pieces. This method makes it possible to produce a semiconductor piece having insulating layers and conductive layers stacked on one principal surface thereof. The insulating layer and the conductive layer can be used respectively as a gate insulating layer and a gate electrode.

In the manufacturing method of the present invention, the sacrificial layer may be made of a crystal. For example, the sacrificial layer may be made of SiGe crystal (for example, a single crystal), and the semiconductor layer may be made of crystalline silicon (for example, a single crystal). A single crystal semiconductor layer can be formed by using a sacrificial layer made of a single crystal and by forming a semiconductor layer with a material which can form a heterostructure.

In the manufacturing method of the present invention, the sacrificial layer may be an organic polymer layer. In Step (i), the semiconductor layer may be stacked by bonding the semiconductor layer using the organic polymer layer (sacrificial layer). The organic polymer layer is formed of a material capable of bonding the semiconductor layer thereto. An example of such a material is polyvinyl alcohol.

In the manufacturing method of the present invention, the semiconductor layer may be made of a crystal. By using the semiconductor layer made of a crystal, pieces of a semiconductor crystal can be produced.

In the manufacturing method of the present invention, the semiconductor layer may be made of a single crystal. By using the semiconductor layer made of a single crystal, pieces of a semiconductor single crystal (semiconductor single crystal film) can be formed. Since a single crystal has a high mobility, it is preferred as a material of a field-effect transistor. The semiconductor layer may be made of either a polycrystal or an amorphous. By using polycrystal semiconductor layer, polycrystal semiconductor pieces can be obtained. By using an amorphous semiconductor layer, amorphous semiconductor pieces can be obtained. Any of a single crystal semiconductor layer, a polycrystal semiconductor layer and an amorphous semiconductor layer is formed depending on the manufacturing conditions of the semiconductor layer.

The manufacturing method of the present invention further may include a step of dispersing the semiconductor pieces into a liquid after Step (iii). Examples of the liquid will be described later.

[Field-Effect Transistor (FET)]

A FET of the present invention includes a semiconductor piece, a source electrode, a drain electrode, and a gate electrode. Two low-resistance regions are formed in the semiconductor piece, and at least a portion of a region sandwiched by the two low-resistance regions serves as a channel region. The source electrode is connected to one of the low-resistance regions of the semiconductor piece. The drain electrode is connected to the other low-resistance region of the semiconductor piece. The gate electrode is disposed in the vicinity of the semiconductor piece. A gate insulating film exists between the gate electrode and the semiconductor piece.

A FET semiconductor piece can be manufactured by the method of the present invention. The semiconductor piece may be a single crystal, a polycrystal, or amorphous. Since the semiconductor piece has been described above, an overlapping description thereof may be omitted.

An insulating film may be formed on one principal surface of the semiconductor piece which is located at the side of the gate electrode. This insulating film serves as a gate insulating film.

The low-resistance regions may be doped with an impurity with a concentration of at least $1\times10^{18}$ atoms/cm$^3$.

A region made of an alloy of a metal and a semiconductor that forms the semiconductor piece may exist in the low-resistance regions. For example, the semiconductor piece may be made of silicon, and a region made of silicide may exist in the low-resistance regions.

In the field-effect transistor of the present invention, the semiconductor piece may be made of silicon.

[Manufacturing Method of Field-Effect Transistor (FET)]

In the method of the present invention for manufacturing a field-effect transistor, the process begins by manufacturing a semiconductor piece by the manufacturing method of the present invention (Step (I)). Next, the semiconductor piece is disposed on a substrate. Then, a source electrode and a drain electrode are connected to the semiconductor piece (Step (II)). This process enables the semiconductor piece to serve as a channel region. The source electrode and the drain electrode may be previously formed on the substrate, followed by disposing the semiconductor piece on the substrate and, at the same time, connecting the source electrode and the drain electrode to the semiconductor piece. The gate insulating layer and the gate electrode are formed, when necessary. Portions other than the semiconductor piece can be formed by a known method. According to the method of the present invention, a thin-film transistor can be manufactured.

Hereinafter, embodiments of the present invention will be described with reference to the accompanying drawings. The same reference numerals are used to denote the same parts or members, and an overlapping description thereof may be omitted. The following embodiments will describe examples in which the semiconductor layer is a semiconductor crystal layer and pieces of a semiconductor crystal are manufactured. In the present invention, however, the semiconductor layer may be an amorphous semiconductor layer, and amorphous semiconductor pieces may be manufactured. In other words, it is possible to replace a semiconductor crystal layer and a semiconductor crystal piece with an amorphous semiconductor layer and an amorphous semiconductor piece, respectively, in the following description.

Embodiment 1

An example of the manufacturing method of the semiconductor pieces will be described below with reference to FIGS. 1A to 1F and FIGS. 2A to 2E. FIGS. 1A, 1C, 1E, 2A and 2C are top views. FIGS. 1B, 1D, 1F, 2B and 2D are the cross-sectional views of FIGS. 1A, 1C, 1E, 2A and 2C, respectively. The following diagrams are schematic views. In practice, it is possible to manufacture several hundreds or more semiconductor crystal pieces from a single wafer.

First, as shown in FIGS. 1A and 1B, three sacrificial layers 1 and three semiconductor crystal layers 12 are stacked alternately on a substrate 10. These layers are formed by a CVD method.

Examples of materials for the semiconductor crystal layer include Group IV semiconductors such as Si, Ge, SiGe and SiGeC, Group III-V semiconductors such as GaAs, GaP, GaAsP, GaSb, InP, InAs and InAsP, and Group II-VI semiconductors such as ZnS, ZnSe, CdS and CdSe. The semiconductor crystal layer 12 may be either a single crystal layer or a polycrystal layer. By using the semiconductor crystal layer 12 made of a single crystal, a higher-performance field-effect transistor can be produced. The conductivity type (p-type, i-type or n-type) of the semiconductor crystal layer 12 is selected depending on the intended use of the semiconductor crystal piece.

The sacrificial layer 1 is formed of a material having a higher etching rate than the semiconductor crystal layer 12. The etching rate of the sacrificial layer 1 preferably is at least three times higher than that of the semiconductor crystal layer 12, and more preferably at least ten times higher.

The materials of the substrate 10 and the sacrificial layer 1 are selected depending on the crystalline form and the material of the semiconductor crystal layer 12. When the semiconductor crystal layer 12 is made of a Group IV semiconductor, single crystal silicon is used for the substrate 10 and silicon oxide is used for the sacrificial layer 1, for example. When the semiconductor crystal layer 12 is made of polysilicon, a glass substrate also can be used as the substrate 10. When the semiconductor crystal layer 12 is made of microcrystal silicon, a plastic substrate also can be used as the substrate 10. When the semiconductor crystal layer 12 is made of a Group III-V semiconductor, a Group III-V semiconductor crystal substrate or a sapphire substrate is used as the substrate 10, for example. For the sacrificial layer 1, a Group III-V semiconductor having a higher composition ratio of Al than the semiconductor crystal layer 12 is used, for example.

Next, a patterned mask (resist pattern) 14 is formed on the semiconductor crystal layer 12 as shown in FIGS. 1C and 1D. The mask 14 can be formed by a commonly-used photolithography technique.

Next, as shown in FIGS. 1E and 1F, the sacrificial layers 1 and the semiconductor crystal layers 12 that exist in the regions unprotected by the mask 14 are removed. The semiconductor crystal layers 12 are divided into a plurality of semiconductor crystal pieces 12c by this etching. The etching may be conducted by, for example, dry etching. Although the etching stops at the surface of the substrate 10 in FIGS. 1E and 1F, part of the substrate 10 may be etched.

The planar shape of the semiconductor crystal piece 12c is, for example, a rectangle. For example, the short side of the rectangle is around 1 μm to 20 μm, whereas the long side thereof is around 5 μm to 100 μm. The thickness of the semiconductor crystal piece 12c is shorter than the short side of the above rectangle, and is around 20 nm to 5 μm, for example.

Next, the mask 14 is removed, as shown in FIGS. 2A and 2B. Then, the sacrificial layers 1 are removed, as shown in FIGS. 2C and 2D. The sacrificial layers 1 can be removed by wet etching. A large number of semiconductor crystal pieces 12c are separated from the substrate 10 by removing the sacrificial layers 1. In the manufacturing method of Embodiment 1, a larger number of the semiconductor crystal pieces 12c can be produced as the number of the semiconductor crystal layers 12 increases.

An etching solution (etchant) to be used for wet etching is selected depending on the sacrificial layer 1 and the semiconductor crystal layer 12. For example, an AlGaAs single crystal layer, a GaAs single crystal layer, and a mixed solution of aqueous ammonia and hydrogen peroxide solution are used as the sacrificial layer 1, the semiconductor crystal layer 12, and the etchant, respectively. For another example, an AlGaInP single crystal layer, a GaInP single crystal layer, and a mixed solution of sulfuric acid and hydrogen peroxide solution are used as the sacrificial layer 1, the semiconductor crystal layer 12, and the etchant, respectively.

Next, the semiconductor crystal pieces 12c are dispersed in a dispersion medium 16, as shown in FIG. 2E. Thus, an aqueous dispersion of the semiconductor crystal pieces 12c is obtained.

The following will describe an example of the manufacturing method of semiconductor crystal pieces in the case where the semiconductor crystal layers 12 are made of single crystal silicon.

First, the sacrificial layers 1 made of SiGe single crystal and the semiconductor crystal layers 12 made of single crystal silicon are alternately and repeatedly stacked on the substrate 10 made of single crystal silicon. The sacrificial layer 1 and the semiconductor crystal layer 12 can be formed by a UHV-CVD method or an LP-CVD method, for example. Examples of a silicon source gas that may be used include a monosilane gas and a disilane gas, and examples of a germanium source gas that may be used include a germane gas.

A SiGe single crystal layer is, for example, grown epitaxially by supplying a disilane gas and a germane gas at a growth temperature of about 550° C. A Si single crystal layer is, for example, epitaxially grown by supplying a disilane gas at a growth temperature of about 600° C. The thickness of the SiGe single crystal layer is about 200 nm to 300 nm, whereas the thickness of the Si single crystal layer is about 200 nm to 5 μm. The Ge content in the SiGe single crystal layer is about 10 atom % to 50 atom %. In order to increase the ratio between the etching rate of the SiGe single crystal layer and the etching rate of the Si single crystal layer, the Ge content in the SiGe single crystal layer preferably is at least 20 atom %.

Next, the mask 14 is formed by lithography. Then, the sacrificial layers 1 and the semiconductor crystal layers 12 that exist in the regions unprotected by the mask 14 are removed by dry etching. As the dry etching, reactive ion etching using a chlorine gas can be used, for example.

Next, the mask 14 is removed by, for example, oxygen plasma ashing treatment. Next, the sacrificial layers 11 made of SiGe single crystal are removed by wet etching. The sacrificial layers 11 can selectively etched with an etchant obtained by mixing nitric acid, hydrofluoric acid and water, for example, at a ratio (volume ratio) of 60:60:1, respectively. The etching of the sacrificial layers 11 results in the formation of many semiconductor crystal pieces 12c made of silicon single crystal.

Next, the semiconductor crystal pieces 12c are dispersed in a dispersion medium 16. As the dispersion medium 16, a water, an aqueous solution, an organic solvent, or a mixed solution of water and an organic solvent is used, for example. Examples of the organic solvent that may be used include: alcohol such as ethanol, propanol, pentanol, hexanol, and ethylene glycol; ether such as ethylene glycol monomethyl ether; a ketone group such as methyl ethyl ketone; alkane such as hexane and octane; tetrahydrofuran; and chloroform. Examples of the mixed solution of water and an organic solvent include a mixed solution of water and alcohol, and a mixed solution of water and tetrahydrofuran.

According to the above-mentioned manufacturing method, silicon pieces (silicon sheets) can be formed from a commonly-used Si substrate. Therefore, the manufacturing cost can be reduced compared with the conventional manufacturing method. In addition, the above manufacturing method makes it possible to control the thickness of the semiconductor crystal layer 12 so that the thickness of the silicon piece can be controlled. In other words, the above manufacturing method has an advantage of great flexibility in designing the silicon pieces.

Figure 3B:
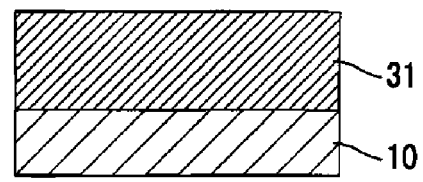
Figure 3C:
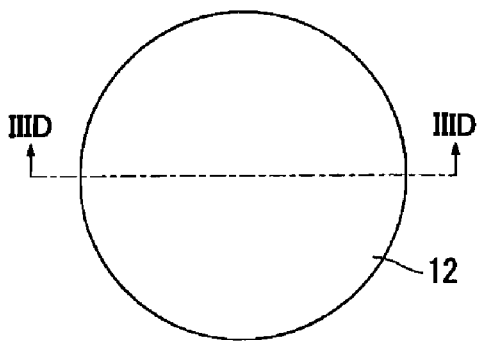
Figure 3D:
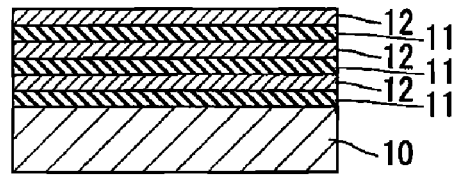

The sacrificial layers 11 and the semiconductor crystal layers 12 may be formed by another method. FIGS. 3A to 3D show an example of the other method for forming the sacrificial layers 11 and the semiconductor crystal layers 12. FIGS. 3A and 3C show top views, and FIGS. 3B and 3D show the respective cross-sectional views thereof.

First, as shown in FIGS. 3A and 3B, a silicon layer 31 is formed on the substrate 10. Next, oxygen is implanted into portions of the silicon layer 31 that are to serve as the sacrificial layers 11, and the resultant layer is then annealed. As a result, the sacrificial layers 11 made of silicon oxide and the semiconductor crystal layers 12 made of crystalline silicon are formed, as shown in FIGS. 3C and 3D. Thereafter, semiconductor crystal pieces are formed by the above-described process.

Another example of the method for forming the sacrificial layers 11 and the semiconductor crystal layers 12 will be described. First, an adhesive layer is formed on the substrate 10. The adhesive layer is made of organic polymer. The adhesive layer can be formed by, for example, spin coating. This adhesive layer is to serve as the sacrificial layer 11. Next, a semiconductor crystal layer is bonded to the adhesive layer. Subsequently, the adhesive layer and the semiconductor crystal layer are stacked in this order. In this manner, the adhesive layers and the semiconductor crystal layers alternately and repeatedly are stacked. Thereafter, the semiconductor crystal pieces are separated from the substrate by dividing the semiconductor crystal layers and removing the adhesive layers. The semiconductor layer can be formed, for example, in such a manner that a single crystal silicon substrate is polished to have a thickness of about several micrometers. The semiconductor layer can be bonded to the adhesive layer by a transfer method, for example. The adhesive layer preferably is a layer that can be removed easily by heat treatment or by a solvent. For example, it is preferable that the adhesive layer be made of a material such as polyvinyl alcohol. This method makes it possible to form the semiconductor crystal pieces without using a liquid that requires careful handling (such as hydrofluoric acid).

Embodiment 2

Figure 4A:
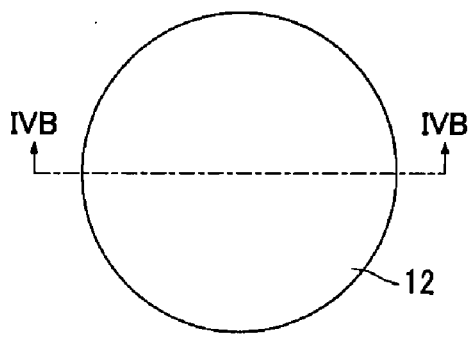
FIGS. 4A to 4F are process diagrams showing still another example of the method of the present invention for manufacturing semiconductor pieces.
Figure 4B:
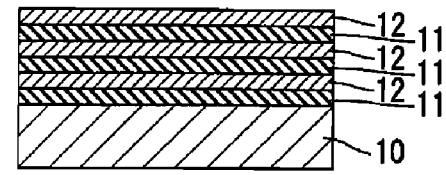
Figure 4C:
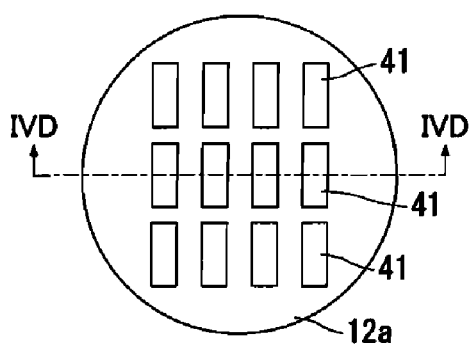
Figure 4D:
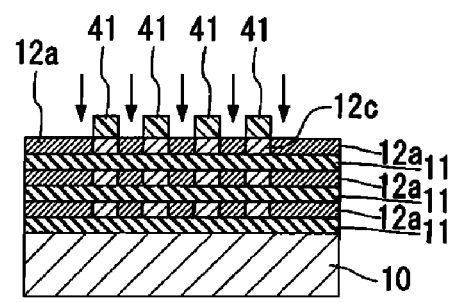
Figure 4E:
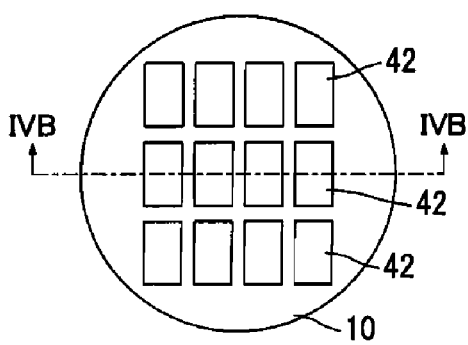
Figure 4F:
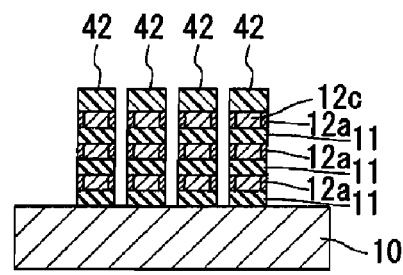

Embodiment 2 will describe an example of a method of manufacturing a semiconductor crystal piece having low-resistance regions at both ends thereof. FIGS. 4A to 4F show part of the manufacturing process of Embodiment 2. FIGS. 4A, 4C and 4E show top views, and FIGS. 4B, 4D and 4F show the respective cross-sectional views thereof.

First, as shown in FIGS. 4A and 4B, the sacrificial layers 11 and the semiconductor crystal layers 12 are alternately stacked on the substrate 10. Next, as shown in FIGS. 4C and 4D, a mask (resist pattern) 41 is formed on the semiconductor crystal layer 12, followed by doping with a high concentration of an impurity. This doping results in the formation of low-resistance regions 12a in part of the semiconductor crystal layers 12. The concentration of the impurity doped in the low-resistance regions 12a is, for example, around $1\times10^{18}$ cm$^{-3}$ to $5\times10^{20}$ cm$^{-3}$, (and preferably at least $5\times10^{19}$ cm$^{-3}$). For this purpose, multi-stage implantation in which the implantation energy level is changed in stages may be carried out to form a plurality of low-resistance regions 12a that are different in depth. The portion surrounded by the low-resistance regions 12a is to be the semiconductor crystal piece 12c.

Next, as shown in FIGS. 4E and 4F, a mask (resist pattern) 42 is formed so as to cover part of the low-resistance regions 12a and the semiconductor crystal pieces 12c. Then, the low-resistance regions 12a and the sacrificial layer 11 that exist in the regions uncovered with the mask 42 are etched. The mask 42 is formed so that the low-resistance regions 12a located at both ends of each semiconductor crystal piece 12c remain.

Figure 5A:
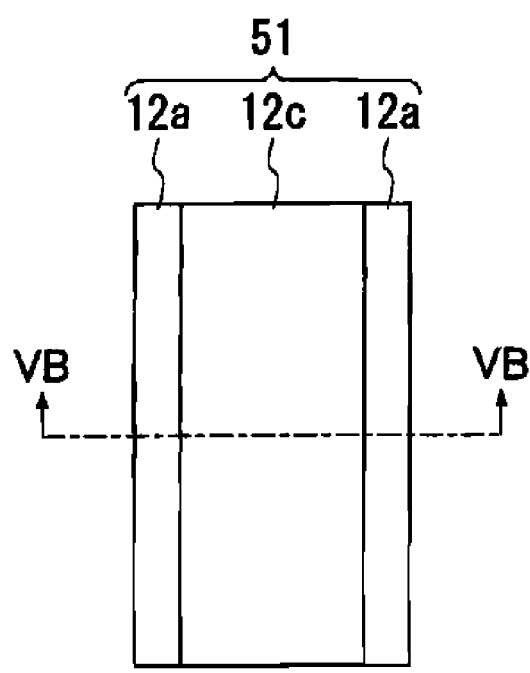
FIGS. 5A and 5B are diagrams showing a semiconductor piece manufactured by the method shown in FIGS. 4A to 4F.
Figure 5B:
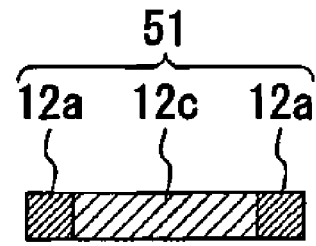

Thereafter, the mask 42 and the sacrificial layers 11 are removed to form a plurality of semiconductor crystal pieces, as is the case with Embodiment 1. According to this method, a semiconductor crystal piece 51 as shown in FIGS. 5A and 5B is obtained. The semiconductor crystal piece 51 includes the semiconductor crystal piece 12c and the low-resistance regions 12a located at both ends of the semiconductor crystal piece 12c.

Embodiment 3

Embodiment 3 will describe an example of a method of manufacturing a semiconductor crystal piece with an insulating layer being formed on one principal surface thereof. FIGS. 6A to 6H show part of the manufacturing process of Embodiment 3. FIGS. 6A, 6C, 6E and 6G show top views, and FIGS. 6B, 6D, 6F and 6H show the respective cross-sectional views thereof.

Figure 6A:
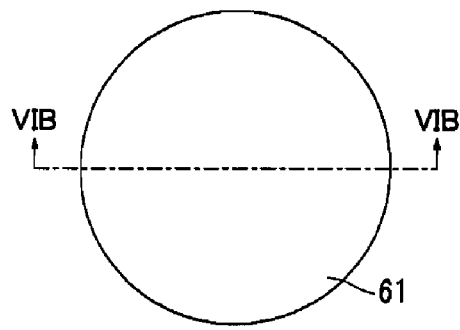
FIGS. 6A to 6H are process diagrams showing still another example of the method of the present invention for manufacturing semiconductor pieces.
Figure 6B:
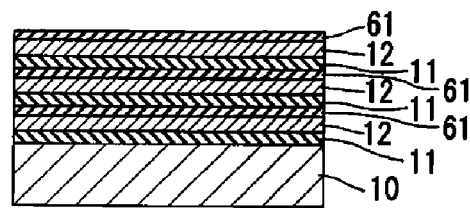

First, as shown in FIGS. 6A and 6B, the sacrificial layer 11, the semiconductor crystal layer 12 and an insulating layer 61 are stacked on the substrate 10 in this order and the stacking is repeated. The insulating layer 61 is formed of a material having a lower etching rate than the sacrificial layer 11, as with the semiconductor crystal layer 12. Examples of a combination of the sacrificial layer 11, the semiconductor crystal layer 12 and the insulating layer 61 include a combination of the sacrificial layer 11 made of silicon oxide, the semiconductor crystal layer 12 made of polysilicon, and the insulating layer 61 made of silicon nitride. The above examples also include a combination of the sacrificial layer 11 made of magnesium oxide, the semiconductor crystal layer 12 made of polysilicon, and the insulating layer 61 made of aluminum oxide.

Figure 6C:
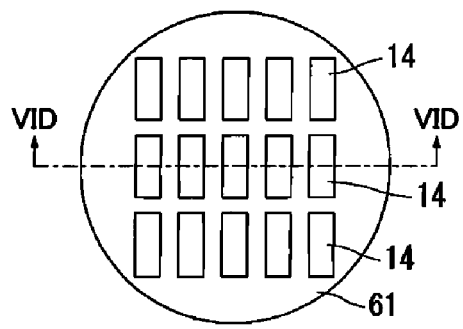
Figure 6D:
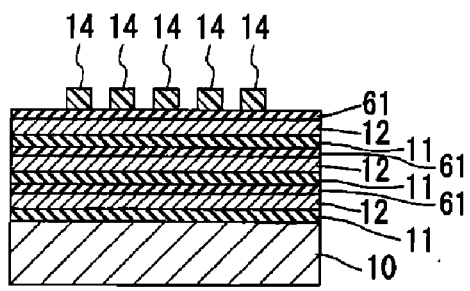
Figure 6E:
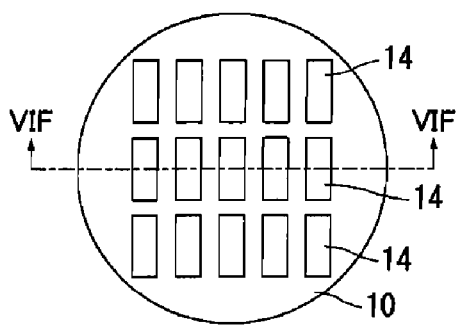
Figure 6F:
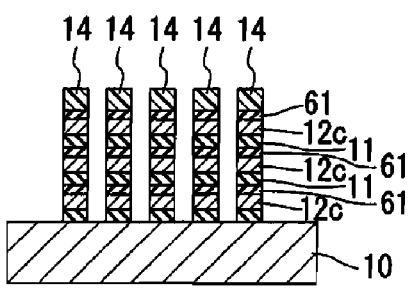

Next, as shown in FIGS. 6C and 6D, the mask 14 is formed on the semiconductor crystal layer 12. Next, as shown in FIGS. 6E and 6F, the sacrificial layers 11, the semiconductor crystal layers 12 and the insulating layers 61 that exist in the regions unprotected by the mask 14 are removed. These layers can be removed by dry etching. The semiconductor crystal layers 12 are divided into the semiconductor crystal pieces 12c by etching.

Figure 6G:
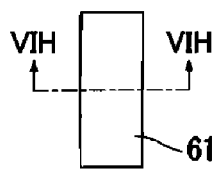
Figure 6H:

Next, the sacrificial layers 11 are removed selectively by wet etching. As a result, as shown in FIGS. 6G and 6H, the semiconductor crystal piece 12c with the insulating layer 61 being formed on one principal surface thereof is formed.

Figure 7A:
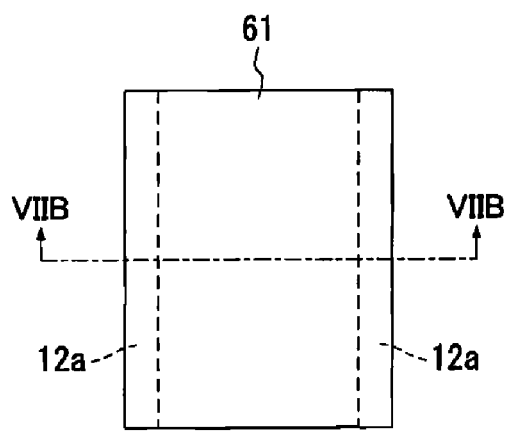
FIGS. 7A to 7D are diagrams showing semiconductor pieces that can be manufactured by the manufacturing method of the present invention.
Figure 7B:
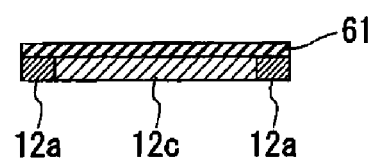

As shown in FIGS. 7A and 7B, it is also possible to form the semiconductor crystal piece 12c with the low-resistance regions 12a being formed at both ends thereof and with the insulating layer 61 being formed on one principal surface thereof. In order to produce the semiconductor crystal piece as shown in FIGS. 7A and 7B, an impurity should be doped into part of the semiconductor crystal layers 12 in the same manner as in FIG. 4D, after the step of FIGS. 6A and 6B.

Figure 7C:
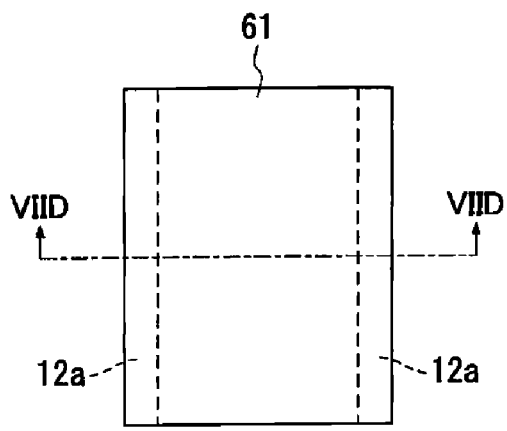
Figure 7D:
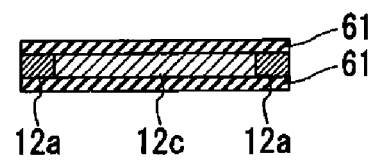

As shown in FIGS. 7C and 7D, it is also possible to form the semiconductor crystal piece 12c with the low-resistance regions 12a being formed at both ends thereof and with the insulating layers 61 being formed on two principal surfaces thereof. In order to produce the semiconductor crystal piece as shown in FIGS. 7C and 7D, the sacrificial layer 11, the insulating layer 61, the semiconductor crystal layer 12 and the insulating layer 61 first are stacked on the substrate 10 in this order and the stacking is repeated. Thereafter, the same process is performed as in the manufacturing process of the semiconductor crystal piece shown in FIGS. 7A and 7B.

Embodiment 4

Embodiment 4 will describe an example of a method of forming a field-effect transistor. Viewed from another aspect, this manufacturing method is a method of manufacturing a semiconductor crystal piece that serves as a field-effect transistor. FIGS. 8A to 8H show part of the manufacturing process of Embodiment 4. FIGS. 8A, 8C, 8E and 8G show top views, and FIGS. 8B, 8D, 8F and 8H show the respective cross-sectional views thereof.

Figure 8A:
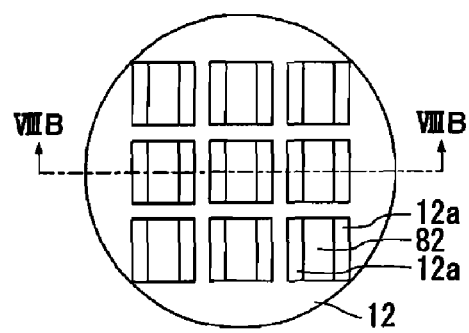
FIGS. 8A to 8H are process diagrams showing still another example of the method of the present invention for manufacturing semiconductor pieces (field-effect transistors).
Figure 8B:
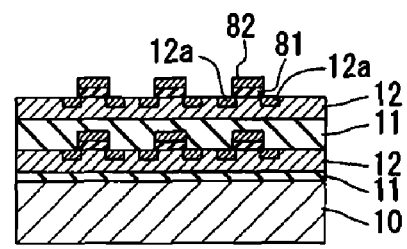

First, as shown in FIGS. 8A and 8B, a plurality of layers are formed on the substrate 10. More specifically, the sacrificial layer 11, the semiconductor crystal layer 12 with the low-resistance regions 12a being formed in a part thereof, a gate insulating layer 81 and a gate electrode 82 are stacked in this order and the stacking is repeated. The gate insulating layer 81 and the gate electrode 82 are formed on the region sandwiched by the two low-resistance regions 12a on the semiconductor crystal layer 12. The sacrificial layer 11 is formed so as to cover the gate insulating layer 81 and the gate electrode.

Figure 8C:
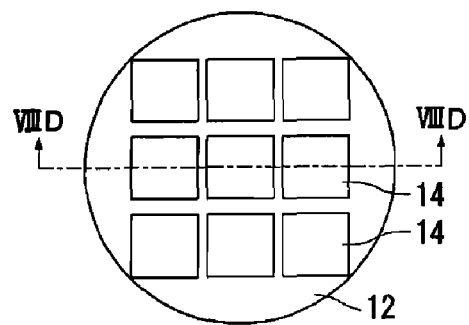
Figure 8D:
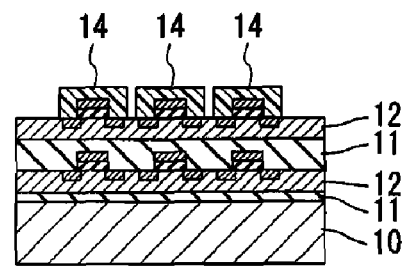
Figure 8E:
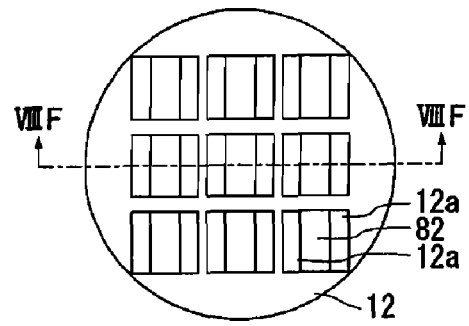
Figure 8F:
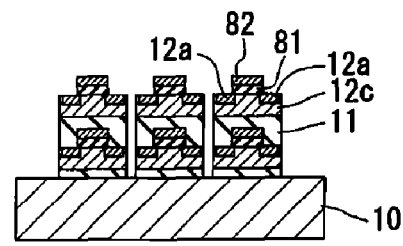

Next, as shown in FIGS. 8C and 8D, the mask 14 is formed to separate adjacent transistors. Next, as shown in FIGS. 8E and 8F, the layers that exist in the regions unprotected by the mask 14 are removed by dry etching, and further the mask 14 is removed.

Figure 8G:
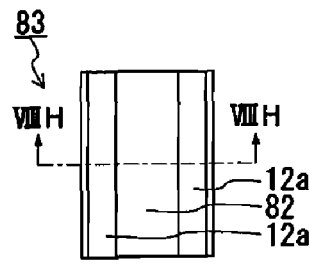
Figure 8H:
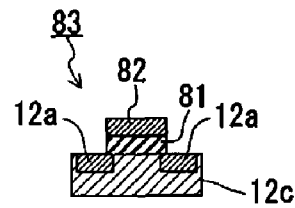

Next, the sacrificial layers 11 are removed selectively. As a result, a plurality of field-effect transistors 83 are separated from the substrate 10. As shown in FIGS. 8G and 8H, the field-effect transistor 83 includes the gate insulating layer 81, the gate electrode 82 and the semiconductor crystal piece 12c provided with the low-resistance regions 12a at both ends thereof.

Embodiment 5

Embodiment 5 will describe an example of a method of manufacturing a field-effect transistor (FET) using a semiconductor crystal piece 51. FIGS. 9A to 9F and FIGS. 10A to 10B show the manufacturing process. FIGS. 9A, 9C, 9E and 10A show top views, and FIGS. 9B, 9D, 9F and 10B show the respective cross-sectional views thereof.

First, as shown in FIGS. 9A and 9B, a gate electrode 92 is formed on a substrate 91. The substrate 91 is not limited, and it may be a glass substrate, or a flexible substrate made of resin or the like. Examples of the flexible substrate that may be used include a substrate made of a material such as polyimide and aromatic polyester. The gate electrode 92 can be made by forming a metal film by a technique such as sputtering and evaporation and then patterning the metal film by a photolithography-etching technique.

Next, as shown in FIGS. 9C and 9D, a gate insulating film 93 is formed to cover the gate electrode 92, and then a lyophilic region 94 is formed in a predetermined region on the gate insulating film 93. The gate insulating film 93 can be formed from the same material and by the same method as in a commonly-used gate insulating film. For example, it can be formed by a coating method or a sputtering method. The gate insulating film 93 may be made of parylene resin or silicon oxide, for example.

The lyophilic region 94 is a region in which the wettability of the dispersion medium of the semiconductor crystal piece 51 is higher than that of a region 95 (the gate insulating film 93 in this case) surrounding the lyophilic region 94. The lyophilic region 94 can be formed by forming a lyophilic film (such as a hydrophilic film) in a portion of the gate insulating film 93. A portion of the gate insulating film 93 also may be subjected to a lyophilizing treatment (such as a hydrophilizing treatment) to form the lyophilic region 94. The lyophilic region 94 is formed in a region where the semiconductor crystal piece 51 is placed.

It is preferable that the shape of the lyophilic region 94 be approximately the same as the planar shape of the semiconductor crystal piece 51 (the shape shown in FIG. 5A). Here, it is assumed that the shape obtained by respectively multiplying the length and width of the largest face (P3) of the semiconductor crystal piece 51 by 0.8 is P3$x$ (area ratio of P3$x$ to P3 is 0.64), and the shape obtained by respectively multiplying the length and width thereof by 1.2 is P3$y$ (area ratio of P3$y$ to P3 is 1.44). In this case, it is preferable that the shape P3$x$ be included in the shape of the lyophilic region 94 and the shape of the lyophilic region 94 be included in the shape of P3$y$.

Furthermore, in order to orient the semiconductor crystal piece 51 in a predetermined direction, it is preferable that the long side of the face (P3) be in a range of 5 to 1000 times longer than the short side.

The lyophilic region 94 is a region for placing the droplet including the semiconductor crystal piece 51 only on the lyophilic region 94. Therefore, the lyophilic region 94 may have any configuration as long as the droplet does not spread beyond the lyophilic region 94 when it is placed there softly. Instead of forming the lyophilic region 94, a region other than the region where the semiconductor crystal piece 51 is to be placed may be a liquid-repellent (water-repellent, for example) region. For example, a liquid-repellent film (water-repellent film) may be formed in a region surrounding the lyophilic region 94.

Examples of a hydrophilic film that may be used include a resin film with the surface thereof being oxidized. Examples of a water-repellent film that may be used include a film made of a polymer material having a fluoroalkyl chain, a thin film made of a silane coupling agent or thiol molecules having a fluoroalkyl chain, and an organic-inorganic hybrid film including a fluoroalkyl chain and formed by a sol-gel method.

Next, as shown in FIGS. 9E and 9F, one semiconductor crystal piece 51 is disposed on the lyophilic region 94. The semiconductor crystal piece 51 is disposed on the lyophilic region 94 in such a manner that the planar shape of the semiconductor crystal piece 51 almost overlaps the lyophilic region 94. More specifically, the semiconductor crystal piece 51 is disposed on the lyophilic region 94 in such a manner that the long sides of both the semiconductor crystal piece 51 and the lyophilic region 94 almost overlap each other and the short sides of them also almost overlap each other. How to dispose the semiconductor crystal piece 51 on the lyophilic region 94 will be described later.

Finally, a source electrode and a drain electrode are formed. For this purpose, these electrodes are formed so as to cover a part of or whole the exposed surfaces of the low-resistance regions 12$a$. These electrodes can be formed of a metal such as gold, nickel and platinum. The source electrode and the drain electrode can be formed by a commonly-used method.

Figure 10A:
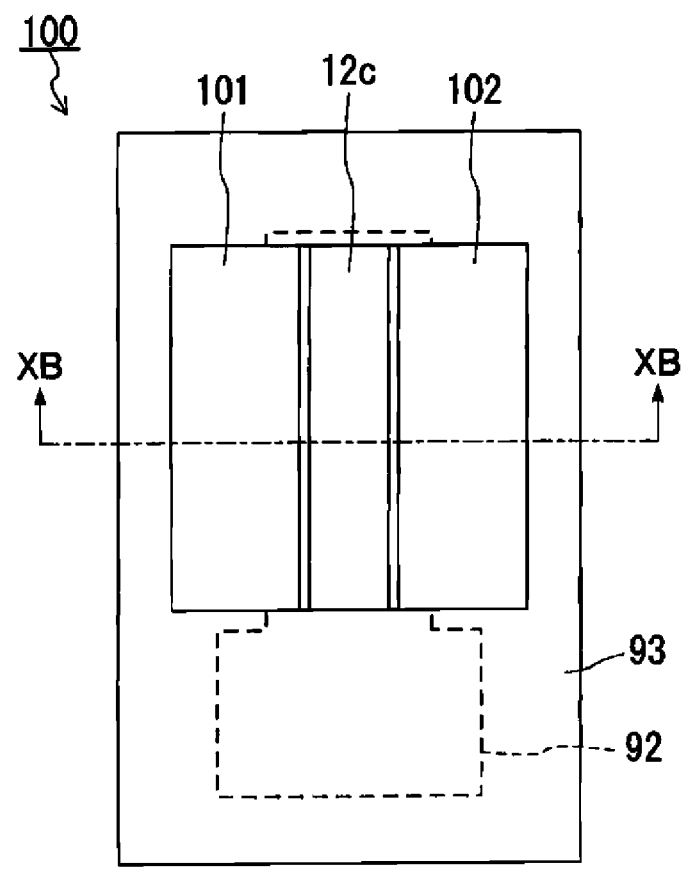
FIGS. 10A and 10B are diagrams showing a field-effect transistor manufactured by the method shown in FIGS. 9A to 9F.
Figure 10B:
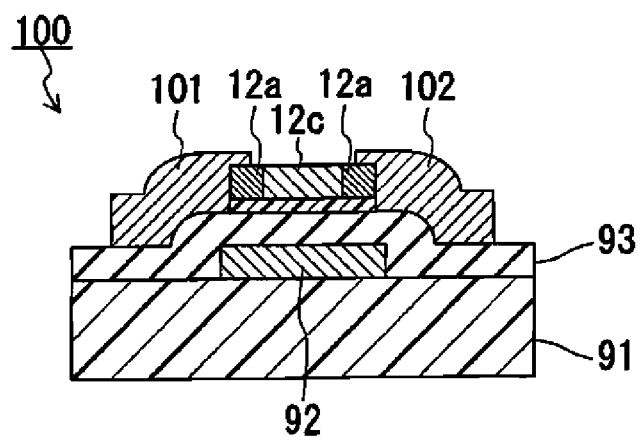

Thus, a FET 100 shown in FIGS. 10A and 10B is formed. The FET 100 includes a substrate 91, a gate electrode 92, a gate insulating film 93, a semiconductor crystal piece 51, a source electrode 101, and a drain electrode 102. The source electrode 101 and the drain electrode 102 respectively are in contact with the low-resistance regions 12$a$ of the semiconductor crystal piece 51. In the semiconductor crystal piece 51, at least a portion of the semiconductor crystal piece 12$c$ sandwiched by the two low-resistance regions 12$a$ serves as a channel region. The conductivity of the channel region is controlled by applying a bias voltage to the gate electrode 102.

[Example of How to Dispose Semiconductor Crystal Piece]

An example of how to dispose the semiconductor crystal piece 51 on the lyophilic region 94 will be described with reference to FIGS. 11A to 11C. First, as shown in FIG. 11A, a droplet 112 including a dispersion medium 111 and only one semiconductor crystal piece 51 placed therein is formed. A method of forming the droplet 112 is not limited. An example of the method of forming the droplet 112 will be described later.

Next, as shown in FIG. 11B, the droplet 112 is disposed on the lyophilic region 94. The droplet 112 does not spread beyond the lyophilic region 94 but stays therein. The shape of the lyophilic region 94 usually is a rectangle that is approximately the same as the planar shape of the semiconductor crystal piece 51. However, the shape of the lyophilic region 94 is not limited as long as the semiconductor crystal piece 51 is placed in a predetermined position.

As shown in FIG. 11C, when the dispersion medium 111 in the droplet 112 evaporates, the semiconductor crystal piece 51 is disposed in the lyophilic region 94. The dispersion medium 111 may be evaporated by air-drying, by heating or air-blowing, or by reducing pressure.

Since the lyophilic region 94 is rectangular, the shape of the dispersion medium 111 on the lyophilic region 94 becomes closer to a rectangular parallelepiped as the dispersion medium 111 evaporates. As a result, the longitudinal direction of the semiconductor crystal piece 51 in the dispersion medium 111 coincides more with the longitudinal direction of the lyophilic region 94 as the dispersion medium 111 evaporates. In this manner, when the dispersion medium 111 completely evaporates, the semiconductor crystal piece 51 is disposed on the lyophilic region 94 in such a manner that two long sides of the lyophilic region 94 and the two longer sides of the semiconductor crystal piece 51 almost overlap one another.

In order to dispose the semiconductor crystal piece 51 in a predetermined direction, the length of the short side of the lyophilic region 94 is set to be shorter than the length of the long side of the semiconductor crystal piece 51.

Next, an example of a method of forming the droplet 112 is described below. First, as shown in FIG. 12A, the dispersion medium 111 is filled into a capillary 120 having a tip with an inner diameter comparable to the dimension of the semiconductor crystal piece. A commercially available glass capillary can be used as a capillary having an inner diameter of at least 100 μm. A capillary having an inner diameter of several micrometers to several tens of micrometers can be formed by heating part of a capillary having an inner diameter of about 100 µm with a burner to extend it.

Next, as shown in FIG. 12B, the droplet of the dispersion medium 111 is formed at the tip of the capillary 120 by applying pressure to the dispersion medium 111.

On the other hand, as shown in FIG. 12C, a plurality of semiconductor crystal pieces 51 are disposed on a substrate 121. The semiconductor crystal pieces 51 may be disposed randomly on the substrate 121. The surface of the substrate 121 is a surface having a low wettability of the dispersion medium 111 (a liquid-repellent surface). The semiconductor crystal pieces 51 can be disposed on the substrate 121 by, for example, dropping a liquid, in which the semiconductor crystal pieces 51 are dispersed, on the substrate 121 and then removing the dispersion medium. Examples of the substrate 121 that may be used include a substrate coated with a water-repellent film and a silicon substrate. Examples of the water-repellant film include an organic thin film made of a silane coupling agent or thiol molecules, and a hybrid organic-inorganic film formed by a sol-gel method.

Next, the droplet formed at the tip of the capillary 120 is put into contact with one of the semiconductor crystal pieces 51 on the substrate 121. At this time, the droplet is not adsorbed to the surface of the substrate 121 because the surface thereof is liquid-repellent. Therefore, the droplet never comes off the tip of the capillary 120. When the droplet comes in contact with the semiconductor crystal piece 51, the piece 51 is taken into the droplet, as shown in FIG. 12D, so that a droplet 112 including the dispersion medium 111 and the semiconductor crystal piece 51 is formed.

As shown in FIGS. 12E and 12F, this droplet 112 is placed in a predetermined lyophilic region (not shown) on a film 122. When the dispersion medium 111 in the droplet 112 evaporates, the semiconductor crystal piece 51 is disposed in a predetermined position on the film 122, as shown in FIG. 12G.

Embodiment 6

An example of a display that can be produced using the semiconductor crystal piece of the present invention will be described below. Embodiment 6 will describe a display produced with an organic electroluminescence element (organic EL element).

Figure 13:
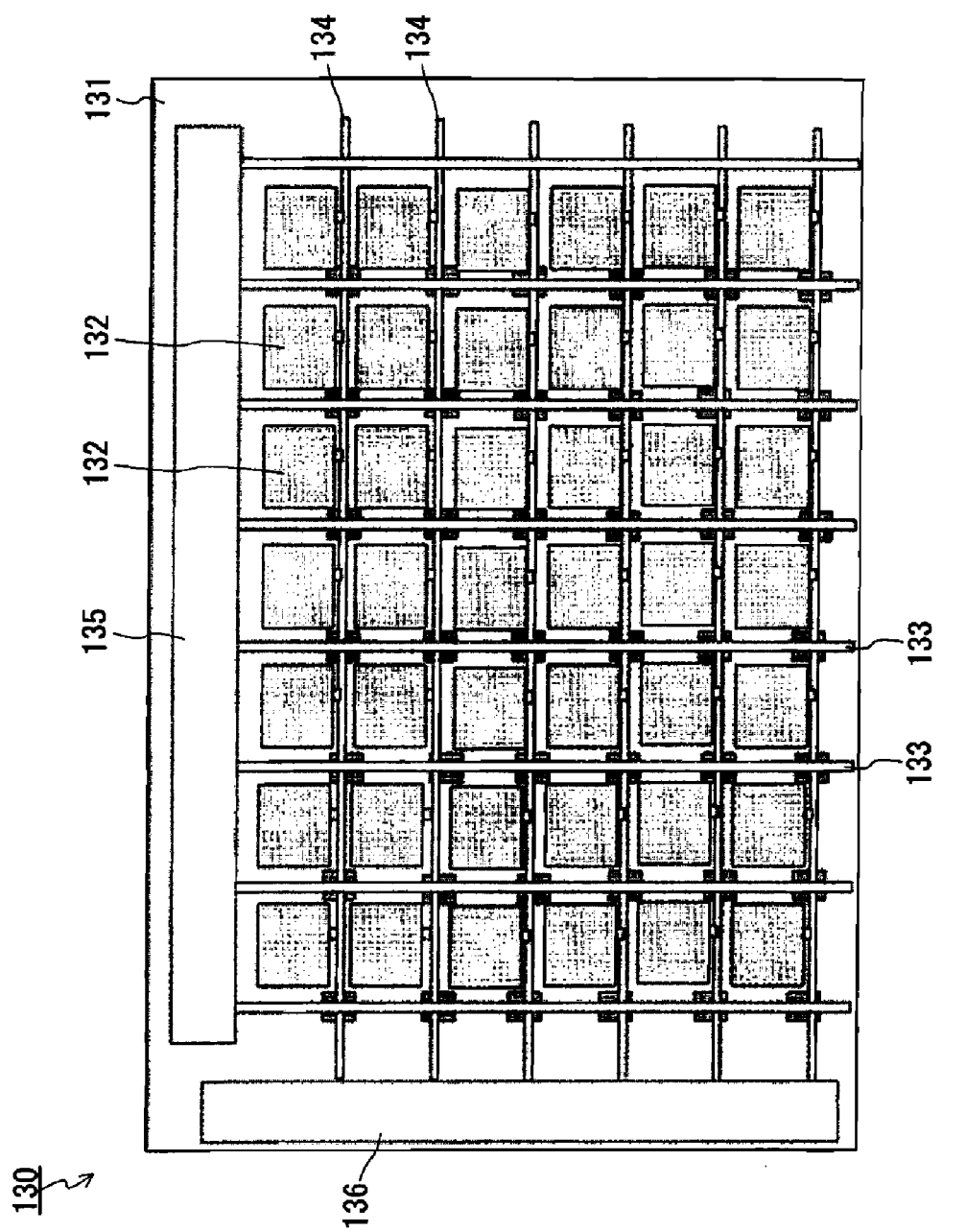
FIG. 13 is a diagram schematically showing a configuration of an organic EL display that can be manufactured by the manufacturing method of the present invention.

FIG. 13 schematically shows a configuration of a display. In a display 130 shown in FIG. 13, a plurality of pixels 132 are arranged in the form of a matrix on a flexible substrate 131. Each pixel is provided with an organic EL element. The organic EL element is controlled by a circuit including a FET and disposed in the vicinity thereof. On the flexible substrate 131, X scanning electrodes 133, Y scanning electrodes 134, an X driver 135, and a Y driver 136 are formed to control the FETs.

Figure 14:
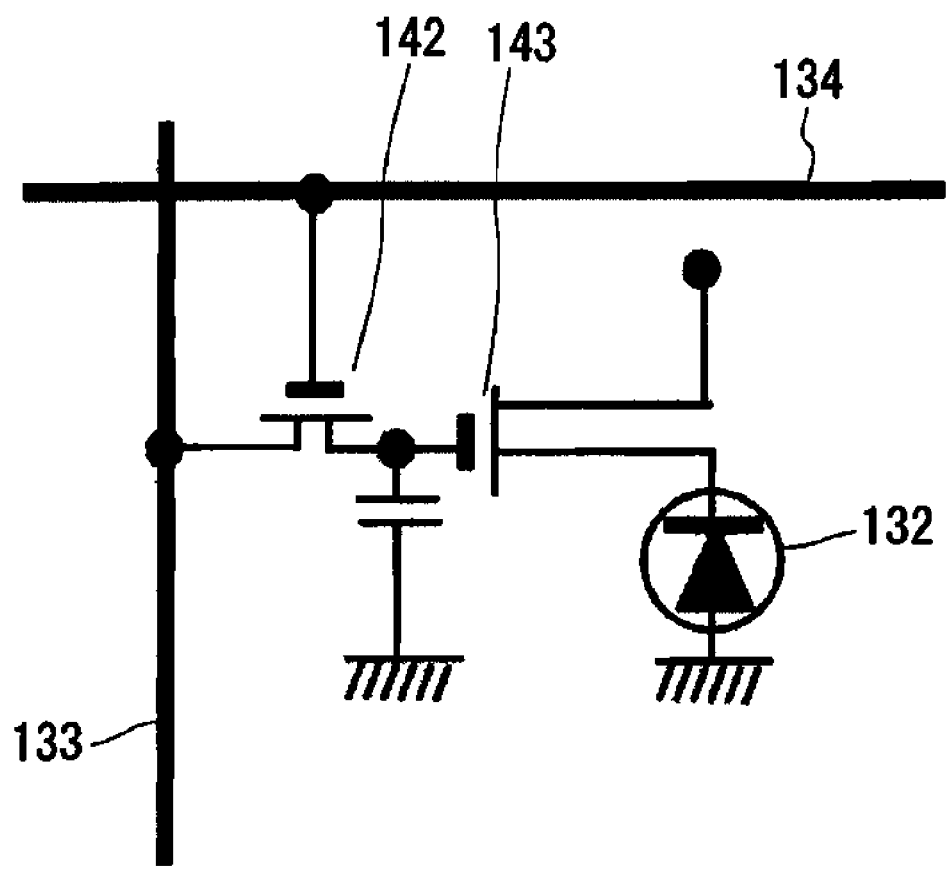
FIG. 14 is a diagram showing a pixel circuit of the organic EL display shown in FIG. 13.

FIG. 14 shows a configuration of the circuit disposed in the vicinity of each pixel. The pixel 132 is controlled by a switching transistor 142 and a driving transistor 143. A voltage is applied from the X driver 135 to the source electrode of the transistor 142 via the X scanning electrode 133. The drain electrode of the transistor 142 and the gate electrode of the transistor 143 are connected electrically to each other. The drain electrode of the transistor 143 is connected electrically to a pixel electrode (not shown) disposed below the pixel. A voltage is applied to the source electrode of the transistor 143 to make the pixel emit light.

On the other hand, an image signal voltage is applied from the Y driver 136 to the gate electrode of the transistor 142 via the Y scanning electrode 134. When the image signal voltage is applied, the transistor 142 applies a voltage to the gate electrode of the transistor 143. Thereby, a voltage is applied from the transistor 143 to the pixel electrode. A transparent electrode is disposed on the pixel, although it is not shown. When a voltage is applied between the pixel electrode and the transparent electrode, the pixel emits light.

The transistors 142 and 143 can be formed by using the method of the present invention. According to the method of the present invention, it is possible to form a field-effect transistor capable of operating at high speed on a flexible substrate.

While the method of the present invention has been described, it should be understood that the semiconductor crystal piece can be produced by another method. The other method is different from the method of the present invention in that both a sacrificial layer and a semiconductor crystal layer are made of a single crystal and that the number of each of these layers should be at least one. The other method is the same as the method of the present invention except the above-mentioned differences. In the other method, the sacrificial layer made of a single crystal is first formed on a substrate, and then the semiconductor crystal layer is formed on the sacrificial layer. The number of each of the sacrificial layers and the semiconductor crystal layers should be at least one. Next, part of the semiconductor crystal layer is etched so as to divide the semiconductor crystal layer into pieces. At this time, part of the sacrificial layer may be etched. Next, the sacrificial layer is removed so that the semiconductor crystal pieces are separated from the substrate. Thus, the semiconductor crystal pieces are produced.

The present invention may be embodied in other specific forms without departing the spirit and the essential features thereof. The embodiments disclosed in this description are given for illustrative purpose in all respects, and the present invention is not limited thereto. The scope of the present invention is set forth by the set of claims, and is intended to cover all the modifications within a spirit and scope equivalent to those of the claims.

INDUSTRIAL APPLICABILITY

The present invention can be used for a method of manufacturing a semiconductor piece, and a field-effect transistor and a method of manufacturing the same. For example, the present invention can be used in manufacturing a FET for driving pixels of a display device. The present invention also can be applied to devices such as an electronic device and a microdevice produced using a flexible substrate.

The invention claimed is:

1. A method of manufacturing a field-effect transistor, comprising the steps of:
    manufacturing a semiconductor piece by:
        (i) stacking a sacrificial layer and a semiconductor layer on a substrate in this order, and repeating the stacking so as to form the semiconductor layers on the substrate, the number of the semiconductor layers being at least two,
        (ii) etching part of the sacrificial layers and part of the semiconductor layers together so as to divide the sacrificial layers into first pieces and the semiconductor layers into second pieces, thereby forming a plurality of multilayered structures on the substrate, each of the plurality of multilayered structures including the first pieces of the sacrificial layers and the second pieces of the semiconductor layers, and
        (iii) removing the first pieces of the sacrificial layers in the multilayered structures so as to separate the second pieces of the semiconductor layers from the substrate;
    forming a droplet of a dispersion medium at a tip of a capillary that is filled with the dispersion medium;

bringing the droplet into contact with the semiconductor piece disposed on a liquid-repellent surface, thereby causing the semiconductor piece to be included in the droplet;

disposing the droplet that includes the semiconductor piece on a lyophilic region of a gate insulating film and allowing the dispersion medium to evaporate so that the semiconductor piece is disposed on the gate insulating film; and connecting a source electrode and a drain electrode to the semiconductor piece.

2. The manufacturing method according to claim 1, wherein in the step (iii), the first pieces are removed by wet etching.

3. The manufacturing method according to claim 1, further comprising a step of lowering the resistance of both ends of the second piece before the step (iii).

4. The manufacturing method according to claim 1, wherein the step (i) is steps of stacking the sacrificial layer, the semiconductor layer, and an insulating layer in this order, and repeating the stacking, and the step (ii) is a step of etching part of the sacrificial layers, part of the semiconductor layers, and part of the insulating layers so as to divide the sacrificial layers into the first pieces, the semiconductor layers into the second pieces and the insulating layers into third pieces, thereby forming the plurality of multilayered structures on the substrate, each of the plurality of multilayered structures including the first pieces, the second pieces and the third pieces.

5. The manufacturing method according to claim 1, wherein the step (i) is steps of stacking the sacrificial layer, the semiconductor layer, an insulating layer, and a conductive layer in this order, and repeating the stacking, and the step (ii) is a step of etching part of the sacrificial layers, part of the semiconductor layers, part of the insulating layers, and part of the conductive layers so as to divide the sacrificial layers into the first pieces, the semiconductor layers into the second pieces, the insulating layers into third pieces and the conductive layers into fourth pieces, thereby forming the plurality of multilayered structures on the substrate, each of the plurality of multilayered structures including the first pieces, the second pieces, the third pieces and the fourth pieces.

6. The manufacturing method according to claim 1, wherein the sacrificial layer is made of a crystal.

7. The manufacturing method according to claim 6, wherein the sacrificial layer is made of SiGe crystal, and the semiconductor layer is made of crystalline silicon.

8. The manufacturing method according to claim 7, wherein the sacrificial layers are removed using an etchant obtained by mixing nitric acid, hydrofluoric acid and water.

9. The manufacturing method according to claim 1, wherein the sacrificial layer is an organic polymer layer, and in the step (i), the semiconductor layer is stacked by bonding the semiconductor layer using the organic polymer layer.

10. The manufacturing method according to claim 1, wherein the semiconductor layer is made of a crystal.

11. The manufacturing method according to claim 1, wherein the semiconductor layer is made of a single crystal.

12. The manufacturing method according to claim 1, wherein the sacrificial layers are formed of a material having a higher etching rate than the semiconductor layers.

* * * * *